United States Patent [19]

Chan

[11] Patent Number: 4,491,937
[45] Date of Patent: Jan. 1, 1985

[54] MULTIPORT REGISTER FILE

[75] Inventor: Daniel F. Chan, Huntington Beach, Calif.

[73] Assignee: TRW Inc., Redondo Beach, Calif.

[21] Appl. No.: 352,293

[22] Filed: Feb. 25, 1982

[51] Int. Cl.³ .............................................. G11C 11/40
[52] U.S. Cl. ..................................... 365/154; 365/155
[58] Field of Search ............... 365/154, 155, 156, 179, 365/189, 190

[56] References Cited

U.S. PATENT DOCUMENTS 3,675,218  7/1972  Sechler ................................. 340/173
4,127,899 11/1978  Dachtera ............................. 365/154
4,150,392  4/1979  Nonaka ............................ 365/155 X Primary Examiner—Joseph A. Popek
Attorney, Agent, or Firm—Noel F. Heal; Robert W. Keller

[57] ABSTRACT

A monolithic storage array (10) having multiple write ports (12, 14) and multiple read ports (16, 18), which may be used simultaneously in any combination. Each cell of the illustrative array has two storage flip-flops (Q1/Q4 and Q5/Q8), one for connection to each read port, and has a switching network (Q9–Q16) for connecting write-port row and column selection signals to set or reset both flip-flops as desired. Row selection for reading is effected by raising a power supply voltage coupled to the flip-flops, to increase noise immunity, and the device has only four isolated collectors, for high device density in monolithic form.

7 Claims, 4 Drawing Figures

MULTIPORT REGISTER FILE

This invention was made with Government support under Contract No. F33615-79-C-1862 awarded by Air Force Systems Command, Aeronautical Systems Division/PMREA. The Government has certain rights in this invention.

BACKGROUND OF THE INVENTION

This invention relates generally to semi-conductor storage arrays, and, more particularly, to integrated-circuit or monolithic storage arrays in which there is a requirement for simultaneous access through more than one input or output port. Semiconductor storage arrays or register files are used in a wide variety of digital applications. In many of these applications, it is required, or at least is highly desirable not only that there be simultaneous reading and writing access to a storage array, but also that there be more than one input port for writing data into the array and more than one output port for reading data from the array. A typical application in the digital signal processing field is an "in-place" algorithm for performing the fast Fourier transform (FFT). In an in-place algorithm, input data are loaded into an array, then the data elements are repeatedly read from the array, operated on in accordance with the algorithm, and stored back in the array, which contains output data at the completion of the process. In applications such as this, simultaneous access to the array through multiple ports is essential for high-speed computation.

In the past, various storage devices have been proposed having more than one input or output access port. For example, in U.S. Pat. No. 4,287,575 issued in the names of Eardley et al., there is disclosed a storage cell having two access ports which may be either used as simultaneous read ports or used together as a single write port. However, it is not possible to read and write simultaneously in the Eardley device. Other patents disclosing two-port memory devices are Robinson, U.S. Pat. No. 4,138,739, Chlig, U.S. Pat. No. 4,280,197 and Dachtera, U.S. Pat. No. 4,127,899.

U.S. Pat. No. 3,675,218 issued in the name of Sechler, also discloses a two-port memory cell, and a four-port device is illustrated, in FIG. 4, but not described in detail. The present invention is directed to an improved multiport device having the same objective as the Sechler FIG. 4 device, i.e., to provide simultaneous reading access through more than one read port and simultaneous writing access through more than one write port. Although Sechler achieves this objective, his FIG. 4 circuitry is not completely satisfactory from two standpoints: immunity to noise and interference between ports, and suitability for efficient implementation in monolithic form.

It will be apparent from the foregoing that there is still a significant need in the field of semi-conductor storage arrays for an improved device having multiple input ports and multiple output ports that may be accessed simultaneously. The present invention satisfies this need, and overcomes the drawbacks of the prior art.

SUMMARY OF THE INVENTION

The present invention resides in a multiport register file of which each cell is accessible through any combination of multiple input ports and multiple output ports, and is highly immune to effects of noise and inter-port disturbance, as well as being very well suited for implementation in monolithic form. The file of the invention may be accessed for simultaneous multiple read operations, simultaneous multiple write operations, or simultaneous multiple read and write operations, all with a high immunity to effects of noise.

Briefly, and in general terms, the multiport register file of the invention comprises a two dimensional array of storage cells identifiable by reference to a row address and a column address in the array, at least two write data ports, each connectable to store data in a selected cell of said array, and at least two read data ports each connectable to retrieve data from a selected cell of the array. The read data ports and write data ports may be used simultaneously in any combination to write data into and read data from selected cells of the array. Significantly, each cell of the array has a separate storage unit for each read port provided, to reduce the effects of noise, and interference between read ports. In addition, row addressing for reading purposes is effected by applying an increased potential to the selected storage units of the selected row. This increases immunity to noise from other rows.

In the illustrative embodiment of this invention, each cell of the array comprises sixteen NPN transistors. However, the transistors are interconnected in such a manner as to employ only four completely isolated collectors. This reduced need for collector isolation provides for a higher device density and a more efficient use of chip surface area.

More specifically, each of the write data ports includes a plurality of row addressing lines for selectively actuating a selected row of the array for writing purposes, a plurality of column addressing lines for actuating a selected column of the array for writing purposes, and row and column address decoding means to provide selection signals to the appropriate row addressing lines and column addressing lines. Similarly, each of the read data ports includes a plurality of row addressing lines, a plurality of column addressing lines, and row and column address decoding means. Means must also be provided for carrying data to and from the selected cell of the array. In practice, separate data lines are not used but rather the row addressing lines or column addressing lines are also used to carry data. For example, the column addressing lines may be line pairs on which differential signals are carried, the signals being reversed or interchanged to indicate a different data state for storage or retrieval. Each of the read data ports also includes a plurality of pairs of sense amplifier coupling transistors, for registering the data stored in a selected cell of the array.

In the illustrative embodiment of the invention, each cell of the storage array includes two binary storage units which are both set to the same stored binary state. The binary storage units are connected to separate row addressing lines, separate column addressing lines and separate sense amplifier coupling transistors, so that the state of a cell can be sensed through a selected read port, corresponding to a selected one of the binary storage units.

Each of the cells in the array also includes switching means for storing data in both storage units in accordance with signals provided on the write port row and column addressing lines, and in accordance with the data to be stored. More specifically, the switching means includes means for producing a signal to set both storage units in the cell or a signal to reset the storage units, depending upon the data to be stored in the cell, provided that the cell is correctly addressed by signals on row addressing lines and column addressing lines associated with one of the write data ports.

In the illustrative embodiment of the data cell, each of the two storage units is a flip-flop and the switching means includes four pairs of transistors. The bases of the first two pairs of the transistors are connected to the row selecting line for the first write port and the bases of the other two pairs of transistors are connected to the row selecting line for the second write port. The first write port has associated with it a different pair of column selecting and data carrying lines. Each of these lines is connected to a pair of the first two pairs of transistors. The collector terminals of one of these first pairs of transistors is coupled to the collector terminals of the two storage units in such a manner as to set both these units to a particular state, while the collectors of the other pair of transistors are coupled to the storage units in such a manner as to reset the units to the opposite state. In a similar manner, the second two pairs of transistors are coupled to receive a differential signal on the column selecting and data carrying lines associated with the second write port, and to generate appropriate setting or resetting signals to the two storage units.

It will be apparent from the foregoing that the present invention represents a significant advance in the field of multiple-access semiconductor storage arrays. In particular, the invention provides an efficient monolithic storage array with high immunity to noise and having multiple read ports and multiple write ports all accessible simultaneously in any combination. It will also be apparent that the invention is, with some practical limitations, expandible beyond the four-port device disclosed in detail in this specification. Other aspects and advantages of the invention will become apparent from the following more detailed description, taken in conjunction with the accompanying drawings.

DESCRIPTION OF THE PREFERRED EMBODIMENT

Figure 1:
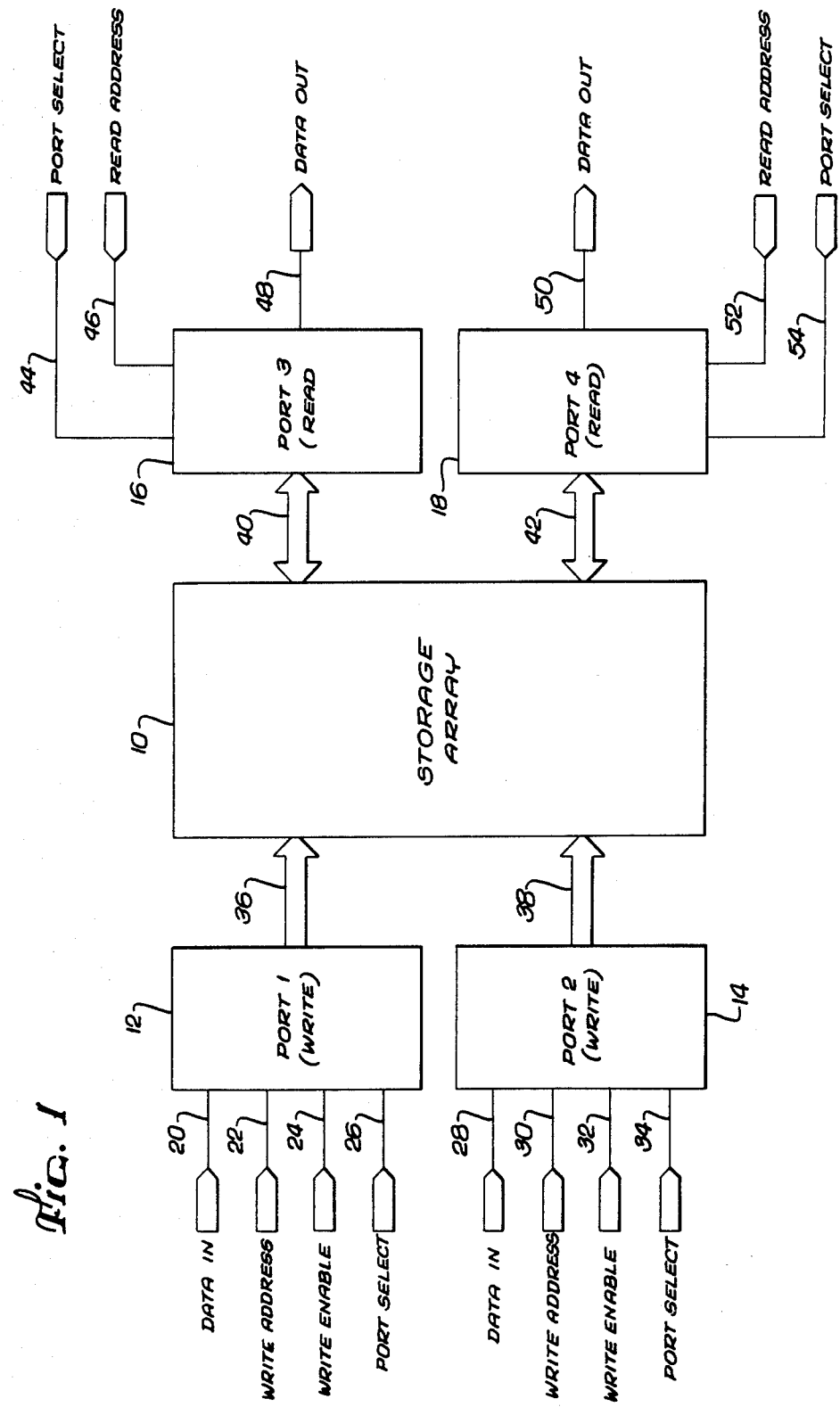
FIG. 1 is a block diagram of a multiport register file configured in accordance with the present invention.

As shown in the drawings for purposes of illustration, the present invention is concerned with semiconductor storage arrays, particularly those of the type that may be accessed through multiple read or write data ports. Such devices are useful in a variety of digital circuits, particularly in digital signal processing circuitry employing pipelined or parallel processing requiring simultaneous access to a storage array for either reading or writing, or both.

In accordance with the present invention, a storage array has at least two write ports and at least two read ports which may be used in a simultaneous manner to access selected cells of a storage array, and each cell of the array is configured to provide high immunity to noise, and to lend itself to high-density monolithic implementation. As shown in the illustrative embodiment of the device, and particularly in FIG. 1, the device of the invention includes a storage array, referred to by reference numeral 10, two write ports 12 and 14, and two read ports 16 and 18. As also shown in FIG. 1, the first write port 12 includes a data input line 20, write address lines 22, a write enable line 24, and a port select line 26. In the embodiment to be discussed in detail, the data input line carries a single binary digit (bit) of information, the write address lines 22 contain as many bits as are necessary to address the storage array 10 by row and column, the write enable line 24 is a single bit of information, and the port selection signal on line 26 is also a single bit of information, although it may be carried on a differential pair of signal lines.

Figure 4:
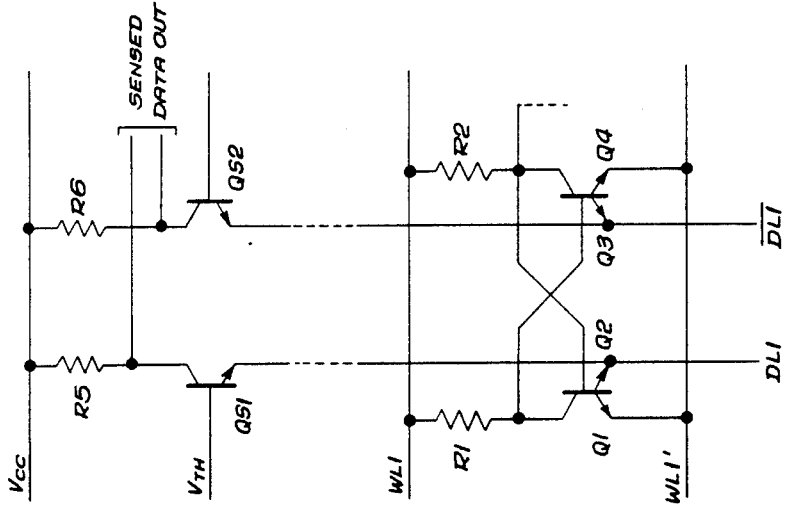
FIG. 4 is a fragmentary schematic diagram illustrating how data is read from a data cell in the device of the invention.

Similarly, the second write port 14 receives a data input line 28, write address lines 30, a write enable line 32 and a port select line 34. The write ports 12 and 14 are coupled to the storage array 10 as indicated by the broad arrows 36 and 38, the details of this interconnection being discussed with reference to FIGS. 2–4. Similarly, the read ports 16 and 18 are coupled to the storage array by the broad arrows shown at 40 and 42. The first read port 16 is provided with a port selection signal on line 44 and a read address on lines 46, the only output from the read port being the data output on line 48. Similarly, the other read port 18 has a data input line 50, read address lines 52, and a port select line 54.

The write ports 12 and 14 and the read ports 16 and 18 are completely independent of each other, in the sense that each may be used independently of and simultaneously with the other ports. Simultaneous requests to write data to the same memory cell in the storage array 10 may result in indeterminate data being stored in that cell. The data stored in the cell in such an instance will be that provided through the port that has the longest write-enable signal. It is assumed, therefore, that user circuitry accessing the storage array 10, through the multiple port system provided, is rationally based and would not normally attempt to write conflicting information into the same storage cell at the same time.

Figure 2:
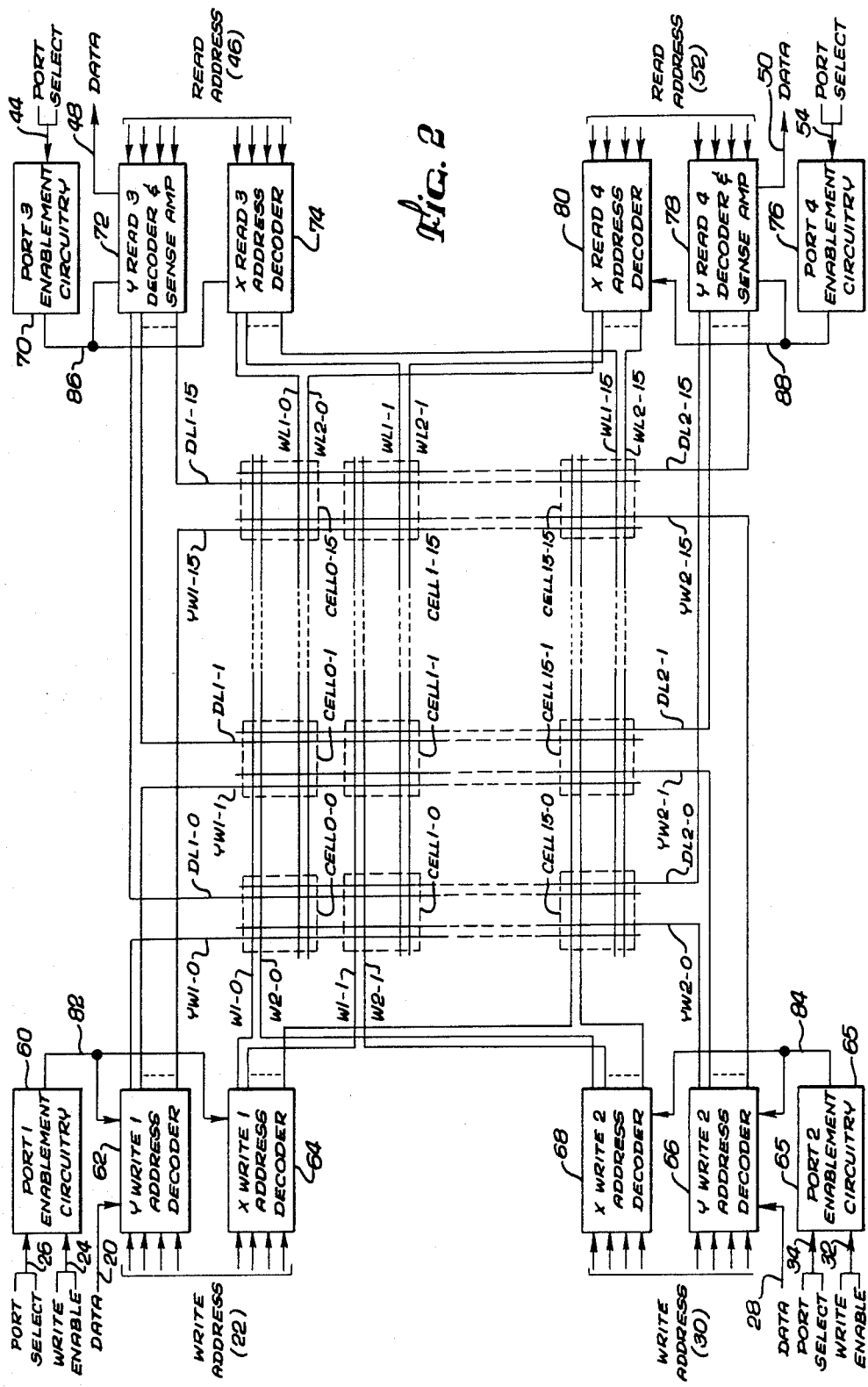
FIG. 2 is a more detailed block diagram of the multiport register file of FIG. 1.

FIG. 2 shows more detail of the multiport device of the invention. The first write port 12 includes port enablement circuitry 60, a y write address decoder 62 and an x write address decoder 64. In similar fashion, the write port 14 includes enablement circuitry 65 a y write address decoder 66, and a x write address decoder 68. Likewise, read port 16 includes port enablement circuitry 70, y read address decoder and sense amplifier 72 and x read address decoder 74. Finally, read port 18 includes port enablement circuitry 76, y read decoder and sense amplifier 78, and x read address decoder 80.

The port enablement circuitry 60 and 65 for the write ports 12 and 14 are identical in function, and have as inputs the port select signals on lines 26 and 34, respectively, and the write enable signals on lines 24 and 32, respectively. Port enablement circuitry 60 generates an output on line 82, to the address decoders 62 and 64, whenever there is a port select signal on line 26 and a write enable signal on line 32. The enabling signal on line 82 conditions the address decoders 62 and 64 to produce appropriate output signals to select a cell by column and row. Similarly, the port enablement circuitry 68 for the second write port 14 produces an enabling signal on line 84 to the address decoders 66 and 68 whenever there is a port select signal on line 34 and a write enable signal on line 32.

For the read buses 16 and 18, the enablement circuitry 70 and 76 is even simpler than the enablement circuitry 60 and 68, since only the port select signals on lines 44 and 54, respectively, are required to enable the appropriate decoders. In practice the port select signals are differential pairs of signals and the enablement circuitry 70 and 76 is required to detect both a high signal level on one of the port select signal lines and a low signal on the other line. In any event, enablement circuitry 70 generates an enabling signal on line 86 to the address decoders 72 and 74. Similarly, enablement circuitry 76 for the second read port 18 generates an enabling signal on line 88 to the y decoder and sense amplifier 78 and the x address decoder 80.

As will become apparent from a study of the circuitry of each storage cell, the data to be stored in a write operation is encoded on differential pairs of lines used for column addressing of the array. Thus, for simplicity in FIG. 2, the data line 20 is shown as being input to the y write address decoder 62. Similarly, data line 28 is shown as being input to y write address decoder 66. As will also soon become apparent, data read from a storage cell in the array 10 is sensed by means of circuitry connected to differential line pairs used for column addressing of the array. Thus, data output line 48 is shown as an output from the y read decoder and sense amplifier 72, and data output line 50 is shown as an output from the y read decoder and sense amplifier 78.

Each of the address decoders 62, 64, 66, 68, 72, 74, 78 and 80 is identical in function, and accepts as an input the row or column address of a selected cell in the storage array 10. For purposes of illustration, the array is shown as having 16×16 or 256 cells, and each row or column address is therefore input as a four-bit word of data. Each address decoder converts the four-bit address to an output signal on one of sixteen output lines from the same decoder. More specifically, the y write address decoder 62 has sixteen output lines labeled YW1-0 through YW1-15. The other y write address decoder 66 has sixteen output lines designated YW2-0 through YW2-15. Both these sets of lines are column addressing lines connected to the cells of the storage array 10 in a column-by-column fashion. Thus, column selecting lines YW1-0 and YW2-0 extend through all the cells in the zero column, which are designated in FIG. 2 as cell 0-0, cell 1-0, and so forth through cell 15-0.

Similarly, column addressing lines YW1-1 and YW2-1 extend through the cells in column 1, and the column addressing lines YW1-15 and YW2-15 extend through the last or 15th column of cells. The x write address decoder 64 and the other x write address decoder 68 likewise have sixteen outputs each used for purposes of row addressing of the array 10. More specifically, x write address decoder 64 has outputs on lines W1-0 through W1-15, and x write address decoder 68 has output lines designated W2-0 through W2-15. Again, lines W1-0 and W2-0 extend through each cell in the first or zero row of the array, lines W1-1 and W2-1 extend through the cells of the first row of the array, and so forth through lines W1-15 and W2-15, which extend through the last or 15th row of the array.

In a similar fashion, the decoders 72, 74, 78 and 80 for the read ports 16 and 18 generate two sets of sixteen addressing lines. Specifically, the y read decoder and sense amplifier 72 has outputs on lines DL1-0 through DL1-15. The other y read decoder and sense amplifier 78 has output lines DL2-0 through DL2-15. Lines DL1-0 and DL2-0 connect to the first or number-zero column of the array, lines DL1-1 and DL2-1 connect to the second or number-one column of the array and so forth through lines DL1-15 and DL2-15, which connect to each cell in the last or 15th column of the array. The x read address decoder 74 generates outputs on lines WL1-0 through WL1-15, while the x read address decoder 80 generates outputs on lines WL2-0 through WL2-15. These x-address or row address lines run rowwise through the array. That is, lines WL1-0 and WL2-0 pass through cells in the first or number-zero row, lines WL1-1 and WL2-1 pass through cells in the second or number-one row and lines WL1-15 and WL2-15 pass through cells in the last or fifteenth row.

It will be seen from this description and from FIG. 2 that each cell in the array has two column addressing lines for writing, two column addressing lines for reading, two row addressing lines for writing and two row addressing lines for reading. As will become apparent from the description of a storage cell in the array, some of these eight addressing lines in a four-port array are in fact pairs of lines, but the logic of FIG. 2 will serve to explain the principles of the device.

Each cell in the array 10 reacts independently to signals supplied from the separate read and write ports 12, 14, 16 and 18. Thus in writing into cell r-c, where r is the row number and c is the column number, the first write port 12 will function to provide signals on lines YW1-c and W1-r. If the writing is done through the second write port 14, signals will be provided on lines YW2-c and W2-r. The data will be encoded in the YW lines since these are each in fact a differential pair capable of carrying one bit of data as well as providing column addressing information. For reading from the first read port 16, and for reading from cell r-c, appropriate signals would be provided on lines DL1-C and WL1-r. If the reading were done from the second read port 18, the signals would be provided instead on lines DL2-c and WL2-r.

Figure 3:
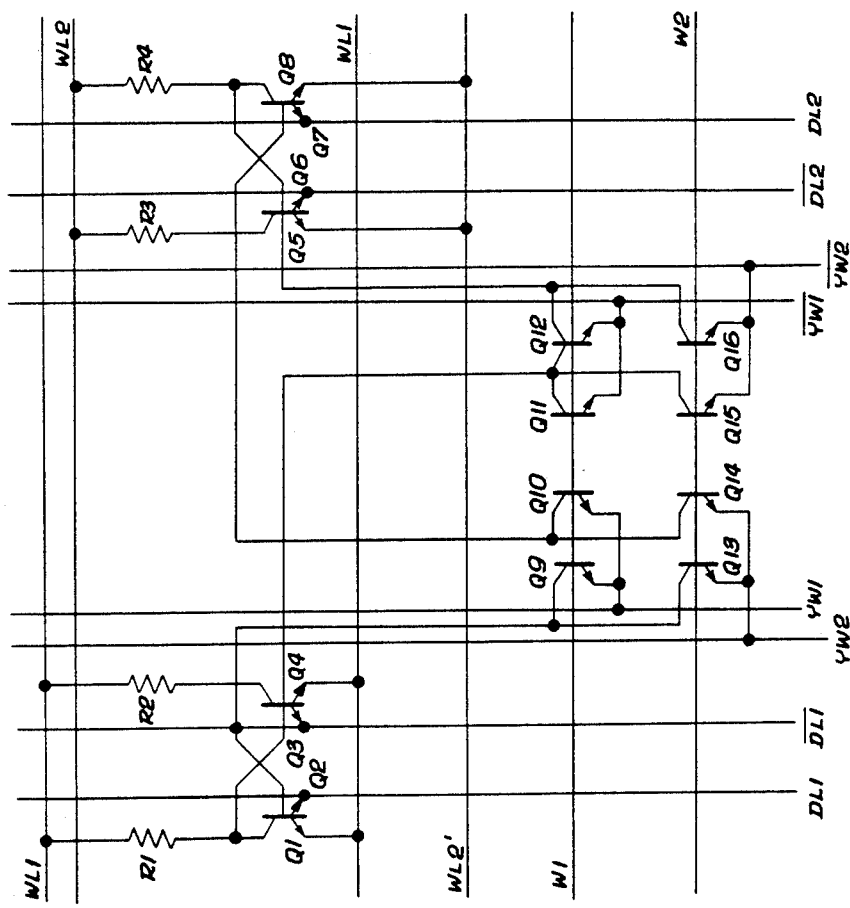
FIG. 3 is a schematic diagram of a storage cell cell used in the devices of FIGS. 1 and 2.

As shown in FIG. 3, each cell of the storage array 10 (FIG. 1) includes sixteen NPN transistors designated Q1 through Q16 and four resistors designated R1, R2, R3 and R4. Transistors Q1 and Q2 are formed as an integrated pair of transistors having a common base, a common collector but two separate emitter terminals. The same is true of Q3 and Q4, Q5 and Q6 and Q7 and Q8. Row addressing lines for reading purposes and designated WL1, WL2, WL1 and WL2 and are shown as passing horizontally through the cell, while row addressing lines for writing purposes are designated W1 and W2 and are also shown passing horizontally through the cell. Column addressing lines for reading purposes are designated DL1 and $\overline{DL1}$, and DL2 and $\overline{DL2}$. Column selection and data carrying lines for writing purposes are YW1 and YW2 and the corresponding inverse lines $\overline{YW1}$ and $\overline{YW2}$.

The collector terminal of transistors Q1 and Q2 is connected through resistor R1 to line WL1. Similarly, the collector of transistors Q3 and Q4 is connected through resistor R2 to line WL1, the collector of transistors Q5 and Q6 is connected through resistor R3 to line WL2, and the collector of transistors Q7 and Q8 is connected through resistor R4 to line WL2. The emitter terminal of transistors Q1 and Q4 are connected to line WL1', and the emitter terminals of transistors Q5 and Q8 are connected to line WL2'. The emitter of transistor Q2 is connected to line DL1, the emitter of transistor Q3 is connected to line $\overline{DL1}$, the emitter of transistor Q6 is connected to line $\overline{DL2}$ and the emitter of transistor Q7 is connected to line DL2. Transistors Q1 and Q4 are cross-connected to form a flip-flop, i.e., the base of transistors Q1/Q2 is connected to the collector of transistors Q3/Q4, and the base of transistors Q3/Q4 is connected to the collector of transistors Q1/Q2. Likewise, transistors Q5 and Q8 are cross-connected to form a flip-flop. The base of transistors Q5/Q6 is connected to the collector of transistors Q7/Q8, and the base of transistors Q7/Q8 is connected to the collector of transistors Q5/Q6.

When transistor Q1 is conductive the voltage drop across resistor R1 causes the collector of transistors Q1/Q2 to be in a relatively low voltage state. Since this low-level condition is coupled to the base of transistor Q4, this transistor will stay in a nonconductive state and the collector of transistors Q3/Q4 will remain at a relatively high voltage level. In a conventional, single-port storage cell, the condition of this flip-flop comprising transistors Q1 and Q4 would be changed by applying a current to one of the lines DL1 or $\overline{DL1}$. If current were applied to line $\overline{DL1}$, for example, this would draw current through transistor Q3 and transistor Q1 would be turned off. In the device of the invention, however, lines DL1 and $\overline{DL1}$ are used only for reading, in a manner which will be explained shortly, and not for writing. Data is written into the cell by applying a signal directly to one or the other of the collectors of the four transistor storage unit comprising transistors Q1–Q4.

Transistors Q9–Q16 are connected as follows. Transistors Q9–Q12 have their bases connected in common to line W1 and transistors Q13–Q16 have their bases connected in common to line W2. The emitters of transistors Q9 and Q10 are connected to line YW1 and the emitters of transistors Q13 and Q14 are connected to the line YW2. The emitters of transistors Q11 and Q12 are connected to line $\overline{YW1}$ and the emitters of transistors Q15 and Q16 are connected to line $\overline{YW2}$. The collectors of transistors Q9 and Q13 are connected together to the collector of transistors Q3 and Q4. The collectors of transistors Q10 and Q14 are connected together to the collector of transistors Q5 and Q6. The collectors of transistors Q11 and Q15 are connected together to the base of transistors Q3 and Q4, which is directly connected to the collector of transistors Q1 and Q2. Finally, the collectors of transistors Q12 and Q16 are connected together to the base of transistors Q5 and Q6 which is directly connected to the collector of transistors Q7 and Q8.

An examination of the switching circuitry comprising transistors Q9–Q16 will show that the state of the storage cell will be appropriately affected by row selection signals on line W1 or W2, column selection signals on lines YW1 and $\overline{YW1}$ or YW2 and $\overline{YW2}$, and by a data bit conveyed by the relative values of the column addressing signals. For example, if the first write port is used, line W1 will be made high to address a particular row and only transistors Q9–Q12 may be turned on. Column selection signals on lines YW1 and $\overline{YW1}$ will energize either transistors Q9 and Q10 or transistors Q11 and Q12 depending on the relative values of signal levels applied to YW1 and $\overline{YW1}$. If YW1 is high and $\overline{YW1}$ is low, transistors Q9 and Q10 will be switched on, and current will be drawn through resistors R2 and R3 as a result. Thus, a low voltage will be found at the collectors of transistors Q4 and Q5, and a high voltage at the collectors of Q1 and Q8. For storage of data in a reverse sense, $\overline{YW1}$ will be made low and current will flow through transistors Q11 and Q12 and resistors R1 and R4, thereby lowering the collector voltage of transistors Q12 and Q8. Similarly, if the second write port is used, line W2 will be applied to the bases only of transistors Q13–Q16, and, depending on the relative state of levels on lines YW2 and $\overline{YW2}$, either transistors Q13 and Q14 will be energized or transistors Q15 and Q16 will be energized. Since the collectors of Q13 and Q14 are connected to the collectors of Q9 and Q10, respectively, and the collectors of Q15 and Q16 are connected to the collectors of Q11 and Q12, respectively, it will be seen that storage of data through this channel will have the same effect as storage of data through the first described write channel.

Reading of data from a storage cell is effected by selecting either line WL1 or line WL2 for row selection, and by selecting either lines DL1 and $\overline{DL1}$ or lines DL2 and $\overline{DL2}$, for column selection. Each column in the array has associated with it a pair of sense amplifier coupling transistors for deriving the state of the selected data cell without disturbing that state. The circuitry for this is conventional and similar to that used in a single-port storage cell. Simplified circuitry is shown by way of example in FIG. 4, which shows sense amplifier coupling transistors QS1 and QS2 connected respectively in the lines DL1 and $\overline{DL1}$. Specifically, the emitter of transistor QS1 is connected to line DL1 and the emitter of transistor QS2 is connected to line $\overline{DL1}$. The collector of transistor QS1 is connected through a resistor R5 to a power supply voltage, and the collector of transistor QS2 is connected through resistor R6 to the same power supply voltage. The collectors of transistors QS1 and QS2 provide an indication of the sensed data, as will be described. The base of transistors QS1 and QS2 are commonly connected to a bias voltage $V_{TH}$. $V_{TH}$ is selected to be a value falling between the logical high and low voltages of the flip-flops in the storage cell such as the Q1–Q4 flip-flop. By way of example, if transistor Q4 is on, and the collector of transistors Q1 and Q2 is in a high voltage condition and the collector of transistors Q3 and Q4 is in a low voltage condition, then the base of transistors Q3 and Q4 will also be high. It also follows that the emitter of Q3 will be high. Since the latter is connected to the emitter of QS2, this transistor will not be conductive. On the other hand, the base of transistors Q1 and Q2 will be held low, as will the emitter of transistor QS1, which will become conductive.

In this manner, the state of the flip-flop comprising transistors Q1 and Q4 can be sensed at the collector terminals of transistors QS1 and QS2. Note that the voltage on line WL1 is raised only for the selected row. Line WL1 for a non-selected row remains at a lower voltage level and provides standby current through either Q1 or Q4 to maintain a stored data state in the cell. When the current is drawn through lines DL1 and $\overline{DL1}$ to effect reading, current will also be drawn through either Q2 or Q3 of the selected cell. Using the same example, if transistor Q4 is on, Q3 will be switched on at reading time, but transistor Q2 will not, and the DLI current will be drawn through transistor QS1. For cells in non-selected rows, neither Q2 nor Q3 will be turned on by the reading current in DL1 and $\overline{DL1}$.

It will be apparent from FIG. 3 that only four isolated collectors are employed in the sixteen transistors. This factor provides for a high device packing density in the device and makes it well suited for monolithic fabrication. Also important is the reading technique, whereby a row is selected by raising its power supply voltage, rather than by using a switching transistor to select the row. The raised supply voltage in the selected row renders it very much immune to noise and other possible disturbances.

It will be appreciated from the foregoing that the present invention represents a significant advance in the field of monolithic semiconductor storage arrays. It will also be appreciated that, although a specific embodiment of the invention has been described in detail for purposes of illustration, various modifications may be made without departing from the spirit and scope of the invention. Accordingly, the invention is not to be limited except as by the appended claims.

I claim:

1. A high-density, monolithic, multiport register file having high immunity to noise, said register file comprising:

a two-dimensional array of storage cells identifiable by reference to a row address and a column address in the array;

a plurality (n) of write ports, each connectable to store data in a selected cell of said array;

a plurality (m) of read ports, each connectable to retrieve data from a selected cell of said array;

wherein said write ports and read ports are operable simultaneously in any combination;

and wherein each cell of said array includes m flip-flops for the storage of a selected data state, and n pairs of transistor switches, one pair for each write port, one switch of each pair being operative to store a first data state in said flip-flops, and the other switch of each pair being operative to store a second data state in said flip-flops;

and wherein said array includes m power supply lines extending through each row of cells and connecting with said respective flip-flops, to provide a first voltage level for rows not selected by one of said read ports and a level of voltage higher than the first level for selected rows, m pairs of read data lines extending through each column of said array and coupled to corresponding ones of said flip-flops, to determine the data state of said flip-flops, n row-selecting lines extending through each row of said array, to allow one pair of said transistor switches in each cell of a selected row to be enabled, and n pairs column-selecting lines extending through each column of said array, to select one of the enabled pair of transistor switches in a selected column of said array and thereby write a selected data state into said flip-flops.

2. A multiport register file as set forth in claim 1, wherein:

each of said flip-flops includes a pair of cross-coupled NPN transistors, each of which has an additional emitter;

said read data lines are coupled to said transistors through said additional emitters; and each of said transistor switches includes m NPN transistors, for supplying a data signal to each of said m flip-flops.

3. A multiport register file as set forth in claim 2, wherein m and n are each equal to two.

4. A high-density, monolithic, multiport register file having high immunity to noise, said register file comprising:

a two-dimensional array of storage cells identifiable by reference to a row address and a column address, wherein each of said storage cells includes two flip-flops for storage of a selected data state, two pairs of transistor switches, one switch of each pair being operative to store a first data state in said flip-flops, and the other switch of each pair being operative to store a second data state in said flip-flops, and wherein said array of storage cells also includes two sets of power supply lines extending through each row of said array, connecting to respective ones of said two flip-flops, said supply lines serving to select a row address for reading by supplying an increased voltage to the selected row, two pairs of column-selecting write lines extending through each column of said array and coupled to said transistor switches to enable one of said switches when a data state signal is provided on one of said pairs of column-selecting write lines;

two read ports, including address decoding means coupled to said two sets of power supply lines in each row and to said two pairs of read data lines in each column, to read data from a selected storage cell through either read port; and two write ports, including address decoding means coupled to said two row-selecting write lines in each row and to said two pairs of column-selecting write lines in each column, to write data to a selected storage cell through either write port;

whereby said read ports and said write ports may be simultaneously active in any combination.

5. A register file as set forth in claim 4, wherein:

each of said flip-flops includes two cross-connected NPN transistors;

each of said transistors has a second emitter; and the lines in each pair of read data lines are coupled to said flip-flops through said second emitters.

6. A register file as set forth in claim 5, wherein:

each of said transistor switches includes two NPN transistors, each having its collector connected to a collector of a different one of said flip-flops and both having their bases connected together to one of said row-selecting write lines and their emitters connected together to one of said column-selecting write lines; and there are a total of eight NPN transistors in said transistor switches, but only four isolated collectors in said switching transistors and said transistors making up said flip-flops.

7. A high density, monolithic, multiport register file having high immunity to noise, said register file comprising:

a two-dimensional array of storage cells identifiable by reference to a row address and a column address in the array;

at least two write ports, each connectable to store data in a selected cell of said array; and at least two read ports, each connectable to retrieve data from a selected cell of said array;

wherein said write ports and said read ports may be used simultaneously in any combination to write data into or read data from selected cells of said array;

and wherein each cell of said array includes a plurality of storage means, each including first and second dual-emitter transistors with collectors and bases cross-connected to form a flip-flop, an equal plurality of pairs of flip-flop power supply lines extending row-wise through said cell, one line of each pair being resistively coupled to the collectors of said transistors and one line being connected to one emitter of each of said transistor, an equal plurality of pairs of read data lines extending columnwise through said cell, one line connected to the other emitter of said first transistor and the other line connected to the other emitter of said second transistor, a plurality of row-selecting write lines, one for each write port, extending row-wise through said cell, a plurality of pairs of column-selecting and write-data lines extending columnwise through said cell, one pair of lines per write port, and a plurality of transistor switches coupled to said column-selecting and write-data lines, to said row-selecting writelines, and to the collectors of said dual-emitter transistors, to store data into said storage means; and wherein each read port functions through a separate one of said storage means, and said write ports operate over said row-selecting write lines and said column-selecting and write-data lines, independently of said read ports.

* * * * *